(12) United States Patent
Tao et al.

(10) Patent No.: US 10,014,179 B2
(45) Date of Patent: Jul. 3, 2018

(54) METHODS FOR FORMING COBALT-COPPER SELECTIVE FILL FOR AN INTERCONNECT

(71) Applicant: APPLIED MATERIALS, INC., Santa Clara, CA (US)

(72) Inventors: Rong Tao, San Jose, CA (US); Tae Hong Ha, San Jose, CA (US); Xianmin Tang, San Jose, CA (US); Joung Joo Lee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 20 days.

(21) Appl. No.: 15/019,587

(22) Filed: Feb. 9, 2016

(65) Prior Publication Data

US 2016/0240432 A1 Aug. 18, 2016

Related U.S. Application Data

(60) Provisional application No. 62/116,148, filed on Feb. 13, 2015.

(51) Int. Cl.
*H01L 21/768* (2006.01)
*H01L 21/285* (2006.01)
*H01L 23/532* (2006.01)

(52) U.S. Cl.
CPC .. *H01L 21/28556* (2013.01); *H01L 21/76843* (2013.01); *H01L 21/76877* (2013.01); *H01L 23/53238* (2013.01); *H01L 23/53257* (2013.01)

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541
USPC ....... 438/303, 591, 618, 421, 584, 637, 783, 438/763
See application file for complete search history.

(56) References Cited

U.S. PATENT DOCUMENTS

| | | | | |
|---|---|---|---|---|
| 2003/0148618 | A1* | 8/2003 | Parikh | H01L 21/76807 438/694 |
| 2004/0206306 | A1* | 10/2004 | Lin | C23C 14/566 118/719 |
| 2010/0167540 | A1* | 7/2010 | Sakuma | C23C 14/046 438/676 |

(Continued)

OTHER PUBLICATIONS

U.S. Appl. No. 14/790,862, filed Jul. 2, 2015, Ganguli et al.

*Primary Examiner* — Moin Rahman
(74) *Attorney, Agent, or Firm* — Moser Taboada; Alan Taboada

(57) ABSTRACT

Methods for processing a substrate include: (a) depositing a cobalt layer to a first thickness within a first plurality of features and a second plurality of features formed in a substrate, wherein each of the first plurality of features and each of the second plurality of features comprises an opening, and wherein a width of the openings of the first plurality of features is less than a width of the openings of the second plurality of features; and (b) heating the substrate to a first temperature to fill the first plurality of features with cobalt material while simultaneously depositing a fill material on the substrate to fill the second plurality of features.

22 Claims, 3 Drawing Sheets

(56) References Cited

U.S. PATENT DOCUMENTS

| | | | |
|---|---|---|---|
| 2010/0295181 A1* | 11/2010 | Yang | H01L 21/76843 |
| | | | 257/751 |
| 2011/0209982 A1 | 9/2011 | Yu | |
| 2011/0298062 A1 | 12/2011 | Ganguli et al. | |
| 2011/0306200 A1 | 12/2011 | Lee et al. | |
| 2012/0028461 A1 | 2/2012 | Ritchie et al. | |
| 2012/0070982 A1 | 3/2012 | Yu et al. | |
| 2012/0108058 A1 | 5/2012 | Ha et al. | |
| 2012/0252207 A1* | 10/2012 | Lei | H01L 21/76885 |
| | | | 438/653 |
| 2013/0127055 A1* | 5/2013 | Chen | H01L 23/53238 |
| | | | 257/751 |
| 2013/0260555 A1* | 10/2013 | Zope | H01L 21/4846 |
| | | | 438/660 |
| 2015/0140805 A1 | 5/2015 | Parikh et al. | |
| 2015/0203961 A1 | 7/2015 | Ha et al. | |
| 2015/0221486 A1 | 8/2015 | Ritchie et al. | |
| 2016/0133563 A1 | 5/2016 | Ai et al. | |

* cited by examiner

METHODS FOR FORMING COBALT-COPPER SELECTIVE FILL FOR AN INTERCONNECT

CROSS-REFERENCE TO RELATED APPLICATIONS

This application claims benefit of U.S. provisional patent application Ser. No. 62/116,148, filed Feb. 13, 2015, which is herein incorporated by reference in its entirety.

FIELD

Embodiments of the present disclosure generally relate to methods for selectively filling different sized features formed on a substrate with cobalt and copper.

BACKGROUND

Copper dual damascene interconnects have been used in the semiconductor industry for years. However, the reduction in semiconductor feature sizes, for example below 10 nm, has led to the use of other fill material such as cobalt, to achieve suitable device performance. The inventors have observed that in interconnects having various feature sizes, filling each of the varying features sizes with cobalt can result in poor electrical properties, such as higher line resistances.

Accordingly, the inventors have developed improved techniques for selectively filling different sized features formed on a substrate with cobalt and copper.

SUMMARY

In some embodiments, methods for processing a substrate include: (a) depositing a cobalt layer to a first thickness within a first plurality of features and a second plurality of features formed in a substrate, wherein each of the first plurality of features and each of the second plurality of features comprises an opening, and wherein a width of the openings of the first plurality of features is less than a width of the openings of the second plurality of features; and (b) heating the substrate to a first temperature to fill the first plurality of features with cobalt material while simultaneously depositing a fill material on the substrate to fill the second plurality of features.

In some embodiments, a method of processing a substrate includes: depositing a barrier layer in a first plurality of features and a second plurality of features formed in a substrate, wherein each of the first plurality of features and each of the second plurality of features comprises an opening, and wherein a width of the openings of the first plurality of features is less than a width of the openings of the second plurality of features; depositing a cobalt layer to a first thickness atop the barrier layer within the first plurality of features and the second plurality of features, wherein the cobalt layer is deposited using a chemical vapor deposition process; transferring the substrate from a chemical vapor deposition process chamber to a physical vapor deposition process chamber; and heating the substrate to a first temperature to fill the first plurality of features with cobalt material while simultaneously depositing a copper material on the substrate via a physical vapor deposition process to fill the second plurality of features.

In some embodiments, a computer readable medium, having instructions stored thereon which, when executed, causes a process chamber to perform a method for processing a substrate. The method may include any of the embodiments disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, that the appended drawings illustrate only typical embodiments of the disclosure and are therefore not to be considered limiting of scope, for the disclosure may admit to other equally effective embodiments.

Figure 1:
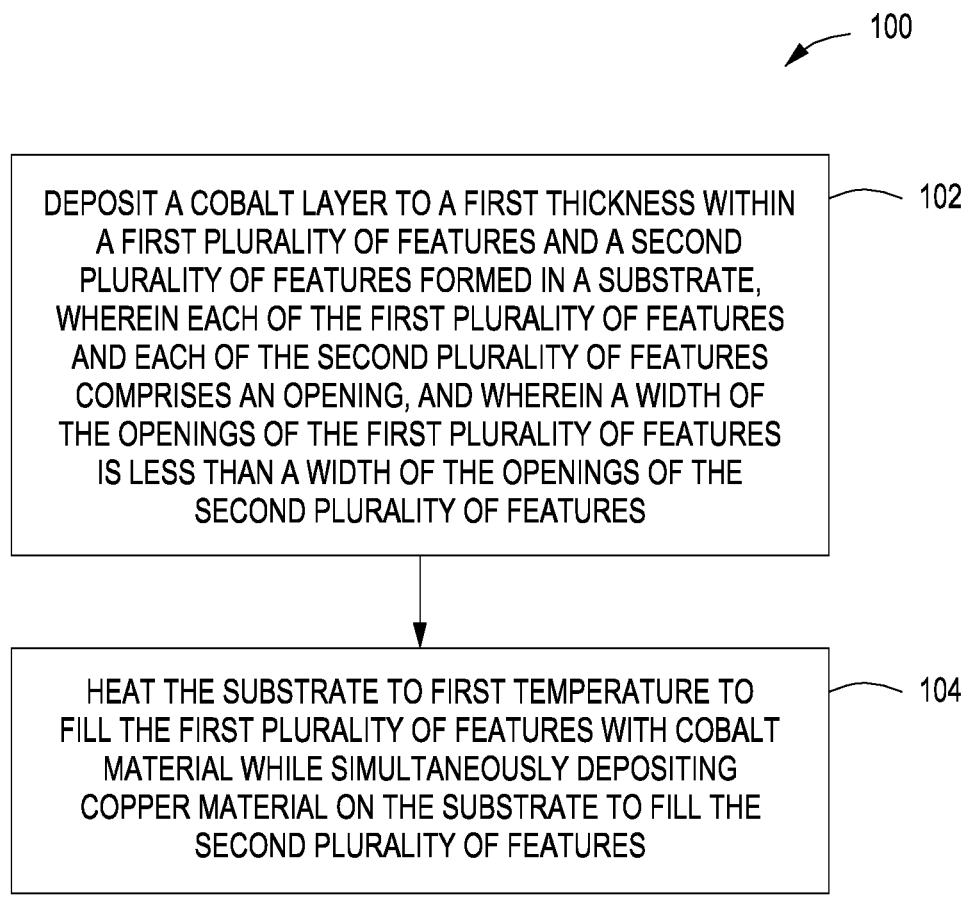
FIG. 1 depicts a flow chart of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for filling different sized features formed on a substrate are provided herein. The inventive methods provided herein advantageously provide the preferential growth of a cobalt fill within narrow features formed on a substrate, while simultaneously providing formation of a copper fill into wider features. The inventive methods described herein advantageously improve line resistance in different sized features formed on a substrate. The inventive methods described herein may be utilized in the formation of metal interconnects in an integrated circuit, or in the formation of a metal gate or a metal-contact gap fill process, as well as other suitable applications having the deposition of a metal fill layer in features of different sizes.

Figure 2:
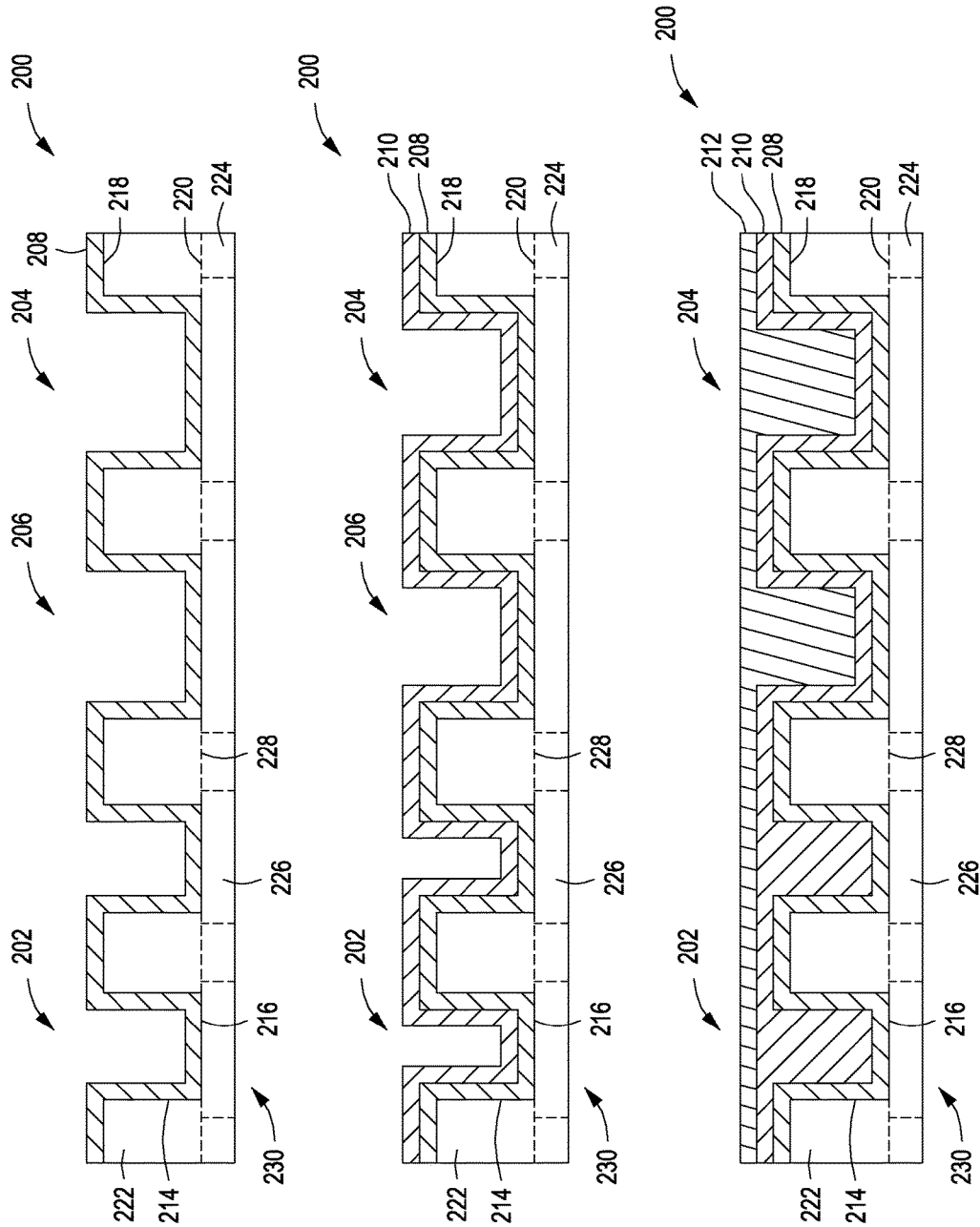
FIGS. 2A-C respectively depict the stages of processing a substrate in accordance with some embodiments of the present disclosure.

FIG. 1 depicts a flow chart of a method 100 for processing a substrate in accordance with some embodiments of the present disclosure. The method 100 is described below with respect to an interconnect structure, as depicted in FIGS. 2A-2C. The method 100 may be performed in suitable process chambers configured for one or more of chemical vapor deposition (CVD), physical vapor deposition (PVD), or atomic layer deposition (ALD). Exemplary processing systems that may be used to perform the inventive methods disclosed herein may include, but are not limited to, any of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including ones available from other manufacturers, may also be suitably used in connection with the teachings provided herein.

The method 100 is performed on a substrate 200 having, as depicted in FIG. 2A, a first plurality of features 202 and a second plurality of features 204 formed in the in the first surface of the substrate 200. Each of the first plurality of features 202 and the second plurality of features 204 comprises an opening 206 formed in the first surface 218 of the substrate 200 and extending into the substrate 200 towards an opposing second surface 220 of the substrate 200.

The substrate 200 may be any suitable substrate having a first plurality of features 202 and a second plurality of features 204 formed in the substrate 200. For example, the substrate 200 may comprise one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 222, such as silicon oxide, a low-k material (e.g., a material having a dielectric constant less than silicon oxide, or less than about 3.9), or the like. The openings 206 may be formed in the first dielectric layer 222. In some embodiments, the first dielectric layer 222 may be disposed atop a second dielectric layer 224, such as silicon oxide, silicon nitride, silicon carbide, or the like. A conductive material (e.g., conductive material 226) may be disposed in the second dielectric layer 224 and may be aligned with the opening 206 such that the opening 206, when filled with a conductive material, provides an electrical path to and from the conductive material. For example, the conductive material may be part of a line or via to which the interconnect is coupled.

The openings 206 may be any suitable openings such as a via, trench, dual damascene structure, or the like. The openings 206 may be formed by etching the substrate 200 using any suitable etch process. The openings 206 are defined by one or more sidewalls 214, and a bottom surface 216. The width of the openings of the first plurality of features 202 is less than the width of the openings of the second plurality of features 204. In some embodiments, the width of the openings of the first plurality of features 202 is about 5 nm to about 20 nm. In some embodiments, the width of the openings of the second plurality of features 204 is about 20 nm to about 200 nm.

In some embodiments, prior to depositing a cobalt layer as described at 102 below, a first layer 208 is deposited atop the first surface 218 of the substrate, and the bottom surface 216 and the sidewalls 214 of the first plurality of features 202 and second plurality of features 204. In some embodiments, the first layer 208 may be a barrier layer material which serves as an electrical and/or physical barrier between the substrate and a metal-containing layer to be subsequently deposited in the opening, and/or may function as a better surface for attachment during a subsequent deposition process. The barrier layer may comprise any material suitable to act as a barrier. For example, in some embodiments, the barrier layer may comprise a metal, for example, titanium (Ti), tantalum (Ta), cobalt (Co), manganese (Mn), tungsten (W), hafnium (Hf), alloys of the foregoing metals, or the like, or in some embodiments, a metal nitride, such as titanium nitride (TiN), tantalum nitride (TaN), tungsten nitride (WN), or the like. The barrier layer may have any thickness suitable to prevent the diffusion of subsequently deposited metal layer materials into underlying layers. For example, in some embodiments, the barrier layer may have a thickness of about 10 angstroms. The barrier layer may be formed by any process suitable to provide the barrier layer having a suitable thickness. For example, in some embodiments, the barrier layer may be formed via a deposition process, such as chemical vapor deposition, physical vapor deposition, or a cyclical deposition process, for example, such as atomic layer deposition, or the like.

In some embodiments, and as illustrated by dotted lines in FIGS. 2A-2C, the opening 206 may extend completely through the substrate 200 and an upper surface 228 of a second substrate 230 and may form the bottom surface 216 of the opening 206. The second substrate 230 may be disposed adjacent to the second surface 220 of the substrate 200. Further (and also illustrated by dotted lines), a conductive material (e.g., conductive material 226), for example as part of a device, such as a logic device or the like, or an electrical path to a device providing electrical connectivity, such as a gate, a contact pad, a conductive line or via, or the like, may be disposed in the upper surface 228 of the second substrate 230 and aligned with the opening 206. In some embodiments, the conductive material (e.g., 226) aligned with the opening 206 may comprise copper.

The method 100 begins at 102, and as depicted in FIG. 2B, a cobalt layer 210 is deposited atop the first surface 218 of the substrate, and the bottom surface 216 and the sidewalls 214 of the first plurality of features 202 and second plurality of features 204.

In some embodiments, the substrate 200 is exposed to a cobalt precursor at a flow rate suitable for depositing the cobalt layer 210. In some embodiments, the substrate is exposed to the cobalt precursor for a period of time sufficient to form the cobalt layer 210 to a first thickness, for example about 25 to about 200 angstroms.

In some embodiments, suitable cobalt precursors may include one or more of cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some embodiments, dicobalt hexacarbonyl acetyl compounds may be used to form cobalt layer 210. Dicobalt hexacarbonyl acetyl compounds may have the chemical formula of $(CO)_6CO_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6CO_2(HC\equiv CtBu)$) is the cobalt precursor. Other examples of dicobalt hexacarbonyl acetyl compounds include dicobalt hexacarbonyl methylbutylacetylene $((CO)_6CO_2(MeC\equiv CtBu))$, dicobalt hexacarbonyl phenylacetylene $((CO)_6CO_2(HC\equiv CPh))$, hexacarbonyl methylphenylacetylene $((CO)_6CO_2(MeC\equiv CPh))$, dicobalt hexacarbonyl methylacetylene $((CO)_6CO_2(HC\equiv CMe))$, dicobalt hexacarbonyl dimethylacetylene $((CO)_6CO_2(MeC\equiv CMe))$, derivatives thereof, complexes thereof, or combinations thereof. Other exemplary cobalt carbonyl complexes include cyclopentadienyl cobalt bis(carbonyl) $(CpCo(CO)_2)$, tricarbonyl allyl cobalt $((CO)_3Co(CH_2CH\!\!=\!\!CH_2))$, or derivatives thereof, complexes thereof, or combinations thereof.

In some embodiments, a reactant gas, such as hydrogen $(H_2)$, may be provided along with the cobalt precursor gas. General processing conditions for forming the cobalt layer 210 discussed above include maintaining process chamber pressure at about 15 to about 25 Torr.

In some embodiments, the cobalt layer 210 may be formed in a suitable reactor, via a plasma assisted deposition process, such as a plasma enhanced chemical vapor deposition process, or a thermal chemical vapor deposition process. In some embodiments, for example, the substrate 200 may be exposed to the cobalt precursor in a plasma state. The plasma may be formed by coupling sufficient energy, for example radio frequency (RF) energy from a power source to ignite the cobalt precursor to form the plasma. In some embodiments, the power source may illustratively provide about 400 watts of power at a suitable frequency, such as about 13.56 MHz. The plasma facilitates a decomposition of the cobalt precursor, causing a deposition of material on the substrate 200, to form the cobalt layer 210.

Next, at 104 and as depicted in FIG. 2C, following deposition of the cobalt layer 210, the substrate 200 is heated to a first temperature to fill the first plurality of features with cobalt material while simultaneously depositing a fill material 212 on the substrate 200 to fill the second plurality of features 204. In some embodiments, the fill material 212 is deposited in a suitable reactor via a physical vapor deposition process. In some embodiments, the substrate 200 is transferred from a chemical vapor deposition (CVD) process chamber following deposition of the cobalt layer 210 to a physical vapor deposition (PVD) process chamber. In some embodiments, the substrate 200 is transferred from the CVD process chamber following deposition of the cobalt layer 210 to the PVD process chamber without exposing the substrate to atmosphere (e.g., within a cluster tool, such as the integrated tool 300 described below with respect to FIG. 3).

In some embodiments, the substrate 200 is heated to a first temperature, for example about 250 to about 450 degrees Celsius, suitable for drawing the deposited cobalt material into the opening 206. The substrate 200 may be heated using any suitable heating mechanism, for example a substrate pedestal heater. The deposited cobalt layer 210 will fill the openings 206 of the narrower first plurality of features 202 but not the openings 206 of the wider second plurality of features 204. In some embodiments, the cobalt layer 210 within the second plurality of features 204 acts as a liner layer. A "liner layer," as used herein, may refer to a layer conformably formed along at least a portion of the sidewalls and/or lower surface of an opening such that a substantial portion of the opening prior to the deposition of the layer remains unfilled after deposition of the layer. In some embodiments, the liner layer may be formed along the entirety of the sidewalls and lower surface of the opening.

In some embodiments, the fill material 212 is a conductive material different than cobalt, such as copper or a copper alloy. In some embodiments, a plasma may be formed in a suitable physical vapor deposition chamber by coupling sufficient energy, for example radio frequency (RF) energy from a power source to ignite a process gas, such as argon, to form the plasma. The plasma facilitates a sputtering of the target material, for example copper, causing a deposition of fill material 212 on the substrate 200. In some embodiments, the fill material 212 is deposited until the openings 206 of the second plurality of features 204 are filled.

In some embodiments, the openings 206 may be filled above the level of the upper surface of the substrate 200 and/or deposited material, for example from the fill material 212, may remain on the upper surface of the substrate 200. Accordingly, techniques, such as wet clean in an acidic solution, chemical or electrochemical mechanical polishing, or the like may be used to remove excess deposited material from the upper surface, such that the openings 206 is filled with the deposited material up to about an equivalent level with the upper surface.

After the first plurality of features 202 and a second plurality of features 204 are filled, the method 100 generally ends and the substrate 200 may proceed for further processing. In some embodiments, subsequent processes such as deposition, etch, annealing, or the like may be performed to fabricate a finished device.

Figure 3:
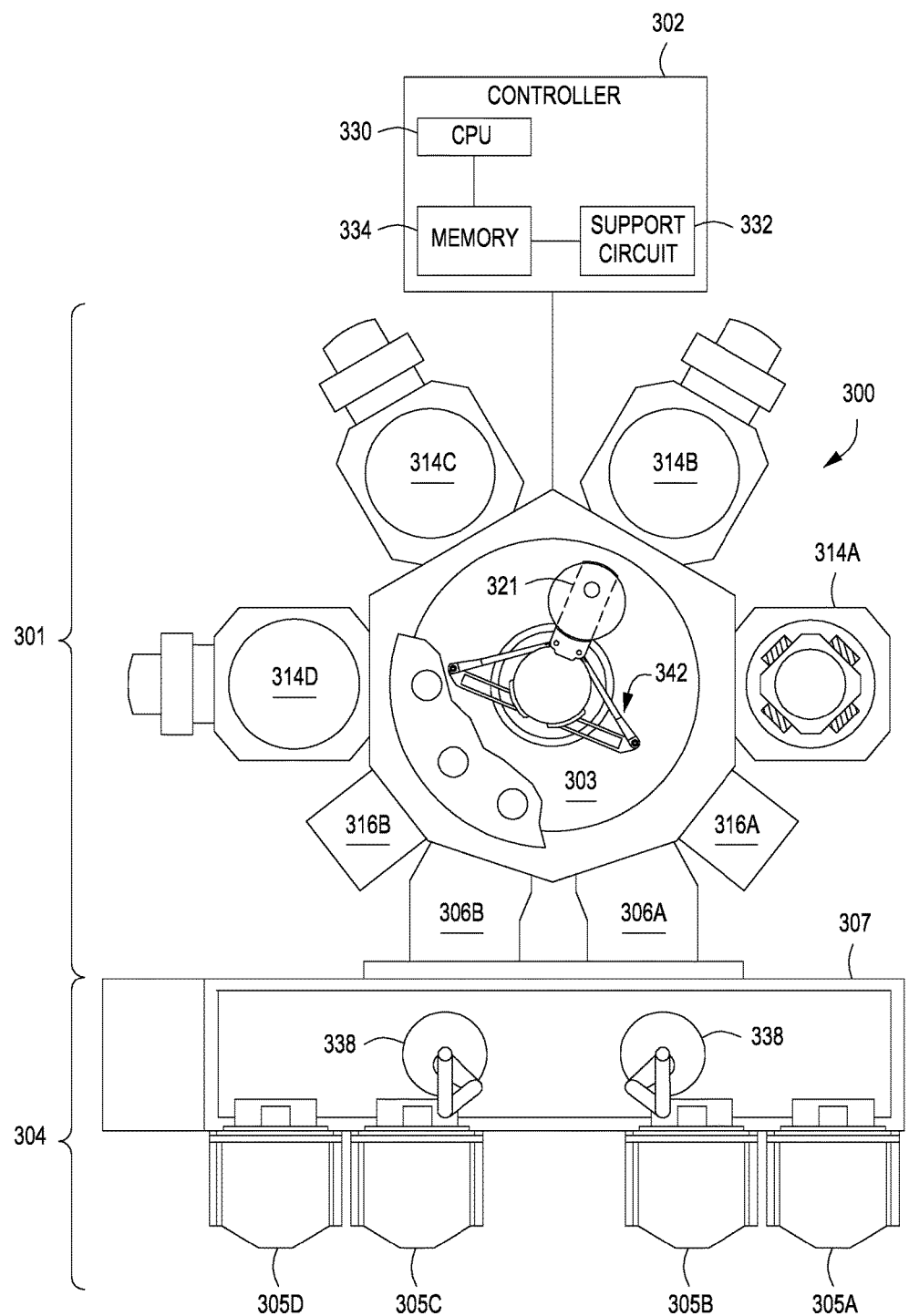
FIG. 3 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 300 (i.e., cluster tool) described below with respect to FIG. 3. Examples of the integrated tool 300 include the CENTURA® and ENDURA® integrated tools, available from Applied Materials, Inc., of Santa Clara, Calif. However, the methods described herein may be practiced using other cluster tools having suitable process chambers, or in other suitable process chambers. For example, in some embodiments the inventive methods discussed above may advantageously be performed in an integrated tool such that there are limited or no vacuum breaks between processes. For example, reduced vacuum breaks may limit or prevent contamination of the substrate.

The integrated tool 300 includes a vacuum-tight processing platform 301, a factory interface 304, and a system controller 302. The processing platform 301 comprises multiple processing chambers, such as 314A, 314B, 314C, and 314D operatively coupled to a vacuum substrate transfer chamber (transfer chamber 303). The factory interface 304 is operatively coupled to the transfer chamber 303 by one or more load lock chambers (two load lock chambers, such as 306A and 306B shown in FIG. 4).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 4. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed in the transfer chamber 303. The vacuum robot 342 is capable of transferring substrates 321 between the load lock chamber 306A and 306B and the processing chambers 314A, 314B, 314C, and 314D.

In some embodiments, the processing chambers 314A, 314B, 314C, and 314D, are coupled to the transfer chamber 303. The processing chambers 314A, 314B, 314C, and 314D comprise at least a chemical vapor deposition (CVD) process chamber and a physical vapor deposition (PVD) process chamber. Additional chambers may also be provided such as additional CVD chambers, annealing chambers, a physical vapor deposition (PVD) chamber, or the like. CVD and PVD chambers may include any chambers suitable to perform all or portions of the methods described herein, as discussed above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller) 302. The software routines may also be stored and/or executed by a second controller (not shown) that is located remotely from the tool 300.

While the foregoing is directed to particular embodiments of the present disclosure, other and further embodiments may be devised without departing from the basic scope of the disclosure.

The invention claimed is:

1. A method of processing a substrate, comprising:
   (a) depositing a cobalt layer to a first thickness within a first plurality of features and a second plurality of features formed in a substrate, wherein each of the first plurality of features and each of the second plurality of features comprises an opening, and wherein a width of the openings of the first plurality of features is less than a width of the openings of the second plurality of features;
   (b) heating the substrate to a first temperature suitable for drawing deposited cobalt material into the opening to fill at least to a level approximately coplanar with the openings of the first plurality of features with cobalt material but not fill the second plurality of features with the deposited cobalt material; and
   (c) simultaneously with (b), depositing a fill material on the substrate to fill the openings of the second plurality of features at least to a level approximately coplanar with the openings of the second plurality of features.

2. The method of claim 1, further comprising depositing a barrier layer in the first plurality of features and the second plurality of features prior to depositing the cobalt layer.

3. The method of claim 2, wherein the barrier layer is titanium nitride (TiN), tantalum nitride (TaN), or tungsten nitride (WN).

4. The method of claim 1, wherein the width of the opening of the first plurality of features is about 5 nm to about 20 nm.

5. The method of claim 1, wherein the width of the opening of the second plurality of features is about 20 nm to about 200 nm.

6. The method of claim 1, further comprising depositing the cobalt layer by first depositing a cobalt precursor layer and then using plasma assisted deposition to deposit the cobalt layer.

7. The method of claim 6, further comprising depositing the fill material using a physical vapor deposition (PVD) process.

8. The method of claim 7, further comprising transferring the substrate from a CVD process chamber to a PVD process chamber.

9. The method of claim 1, wherein the first thickness is about 25 to about 200 angstroms.

10. The method of claim 1, further comprising heating the substrate to a first temperature of about 250 degrees Celsius to about 450 degrees Celsius.

11. The method of claim 1, wherein the fill material is copper or a copper alloy.

12. The method of claim 11, wherein depositing copper or a copper alloy further comprises forming a plasma in a physical vapor deposition chamber from a process gas to sputter copper material from a target comprising copper.

13. A method of processing a substrate, comprising:
   depositing a barrier layer within a first plurality of features and a second plurality of features formed in a substrate, wherein each of the first plurality of features and each of the second plurality of features comprises an opening, and wherein a width of the openings of the first plurality of features is less than a width of the openings of the second plurality of features;
   depositing a cobalt layer to a first thickness atop the barrier layer within the first plurality of features and the second plurality of features, wherein the cobalt layer is deposited using a chemical vapor deposition process;
   transferring the substrate from a chemical vapor deposition process chamber to a physical vapor deposition process chamber; and
   heating the substrate to a first temperature to fill at least to a level approximately coplanar with the openings of the first plurality of features with cobalt material while simultaneously depositing a copper material on the substrate via a physical vapor deposition process to fill at least to a level approximately coplanar with the openings of the second plurality of features.

14. A non-transitory computer readable medium, having instructions stored thereon which, when executed, cause a process chamber to perform the method of claim 1.

15. The non-transitory computer readable medium of claim 14, further comprising depositing a barrier layer in the first plurality of features and the second plurality of features prior to depositing the cobalt layer.

16. The non-transitory computer readable medium of claim 14, wherein the width of the opening of the first plurality of features is about 5 nm to about 20 nm.

17. The non-transitory computer readable medium of claim 14, wherein the width of the opening of the second plurality of features is about 20 nm to about 200 nm.

18. The non-transitory computer readable medium of claim 14, further comprising depositing the cobalt layer by first depositing a cobalt precursor layer and then using plasma assisted deposition to deposit the cobalt layer and depositing the fill material using a physical vapor deposition (PVD) process.

19. The non-transitory computer readable medium of claim 18, further comprising transferring the substrate from a CVD process chamber to a PVD process chamber.

20. The non-transitory computer readable medium of claim 14, further comprising heating the substrate to a first temperature of about 250 degrees Celsius to about 450 degrees Celsius.

21. A method of processing a substrate, comprising:
   (a) depositing a cobalt layer to a first thickness within a first plurality of features and a second plurality of features formed in a substrate, wherein each of the first plurality of features and each of the second plurality of features comprises an opening, and wherein a width of the openings of the first plurality of features is less than a width of the openings of the second plurality of features, wherein the cobalt layer is deposited by first depositing a cobalt precursor layer and then plasma assisted deposition to deposit the cobalt layer; and
   (b) heating the substrate to a first temperature to fill at least to a level approximately coplanar with the openings of the first plurality of features with cobalt material while simultaneously depositing a fill material on the substrate to fill the opening of the second plurality of features at least to a level approximately coplanar with the opening of the second plurality of features wherein the fill material is deposited using a physical vapor deposition (PVD) process, and further comprising transferring the substrate from a CVD process chamber to a PVD process chamber to deposit the fill material.

22. A method of processing a substrate, comprising:
(a) depositing a cobalt layer to a first thickness within a first plurality of features and a second plurality of features formed in a substrate, wherein each of the first plurality of features and each of the second plurality of features comprises an opening, and wherein a width of the openings of the first plurality of features is less than a width of the openings of the second plurality of features; and
(b) heating the substrate to a first temperature to fill at least to a level approximately coplanar with the openings of the first plurality of features with cobalt material while simultaneously depositing a fill material on the substrate to fill the openings of the second plurality of features at least to a level approximately coplanar with the opening of the second plurality of features, wherein the fill material is copper or a copper alloy, and wherein depositing the copper or copper alloy further comprises forming a plasma in a physical vapor deposition chamber from a process gas to sputter copper material from a target comprising copper.

* * * * *